United States Patent
Gyoutoku et al.

(10) Patent No.: US 6,351,066 B1
(45) Date of Patent: Feb. 26, 2002

(54) ORGANIC ELECTROLUMINESCENCE ELEMENT HAVING AN INSULATING BULKHEAD HAVING AN OVERHANG PORTION

(75) Inventors: Akira Gyoutoku, Saga; Takahiro Komatsu, Fukuoka, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/170,551

(22) Filed: Oct. 13, 1998

(30) Foreign Application Priority Data

Oct. 14, 1997 (JP) ............................................. 9-280123

(51) Int. Cl.[7] .............................. H01J 1/62; H01J 63/04
(52) U.S. Cl. ...................... 313/504; 313/506; 313/505; 313/503
(58) Field of Search .................... 313/498, 500, 313/503, 504, 509, 506, 311; 315/169.3; 428/690, 917

(56) References Cited

U.S. PATENT DOCUMENTS

| | | | | |
|---|---|---|---|---|
| 4,803,402 A | * | 2/1989 | Raber et al. ................ | 313/509 |
| 5,675,212 A | * | 10/1997 | Schmid et al. ............... | 313/495 |
| 5,701,055 A | * | 12/1997 | Nagayama et al. .......... | 313/504 |
| 5,773,931 A | * | 6/1998 | Shi et al. ..................... | 313/509 |
| 5,812,226 A | * | 9/1998 | Izumi et al. .................. | 349/73 |
| 5,923,119 A | * | 7/1999 | Hara et al. ................... | 313/506 |
| 5,952,782 A | * | 9/1999 | Nanto et al. ................. | 313/584 |
| 6,013,983 A | * | 1/2000 | Asano et al. ................ | 313/581 |
| 6,037,712 A | * | 3/2000 | Codama et al. ............. | 313/504 |
| 6,114,805 A | * | 9/2000 | Codama et al. ............. | 313/504 |

FOREIGN PATENT DOCUMENTS

JP          8-315981          11/1996

* cited by examiner

*Primary Examiner*—Nimeshkumar D. Patel
*Assistant Examiner*—Mariceli Santiago
(74) *Attorney, Agent, or Firm*—Pearne & Gordon LLP

(57) ABSTRACT

An organic electroluminescence element including a first electrode of a transparent material provided on a substrate of a transparent material. An insulating bulkhead from which a portion of the first electrode is exposed is formed into a thickness so that the insulating bulkhead can be protruded excess to a level of an upper end of the first electrode. An organic thin film is formed on the first electrode and the bulkhead. A second electrode is formed on the organic thin film, wherein the insulating bulkhead comprises an overhang portion and the insulating bulkhead is made of a chromium oxide layer.

12 Claims, 3 Drawing Sheets

*PRIOR ART*

ORGANIC ELECTROLUMINESCENCE ELEMENT HAVING AN INSULATING BULKHEAD HAVING AN OVERHANG PORTION

BACKGROUND OF THE INVENTION

The present invention relates to an electroluminescence element, which will be referred to as "an organic EL element" in this specification hereinafter, used as an element of an organic electroluminescence display. More particularly, the present invention relates to an organic EL element and a manufacturing method thereof in which patterning can be easily conducted when an organic thin film is laminated on an anode and a cathode is formed on the organic thin film.

The organic EL element is used for a back light of a liquid crystal display, a display applied to various types of display units and a light source of an optical communication system. By changing a luminescent material or layer structure, it is possible for the organic EL element to obtain various luminescent wave length including blue luminescence, which is difficult to obtain by a conventional inorganic EL element. Therefore, the organic EL element is widely used in the fields of various luminescent devices and color displays.

According to the basic method of manufacturing an organic EL element, it is manufactured as follows. For example, ITO film (Indium Tin Oxide), which is known as a transparent conductive film, is formed on the surface of a glass substrate so that ITO film can be used as a transparent anode. An organic thin film is laminated on this ITO film. Further, a cathode, which includes a pair electrodes together with the anode formed by ITO film, is formed on this organic thin film by means of metallic vapor deposition. Recently, a method of manufacturing an organic electroluminescence element has been adopted for the purpose of enhancing the insulating property when the cathode is formed by means of vapor deposition and also for the purpose of preventing a short circuit between the cathode and ITO film formed as an anode. The manufacturing method includes a process in which an upper end portion of an electrically insulating bulkhead provided between the organic thin film and the laminated body of the cathode and also provided between the cathodes is formed into a T-shape in the longitudinal cross-sectional shape.

The above method of manufacturing an organic electroluminescence element, in which the overhang portion is formed in the manufacturing process, is disclosed in, for example, JP-A (Japanese Unexamined Patent Publication No.) 8-315981 and others. The essential concept of the above manufacturing method is shown in FIGS. 4A–4F.

As shown in FIG. 4A, an anode is made of a transparent electrode 52 on a glass substrate 51 by means of patterning, wherein an electrically conductive transparent ITO is subjected to patterning for forming the transparent electrode 52. In this case, a plurality of rows of transparent electrodes 52 are provided in parallel to each other on a glass substrate 51 in the uniform thickness. A film of polyimide 53, which is an unphotosensitive and electrically insulating material, is formed by, for example, the method of spin coating. This film of polyimide 53 is formed on both the glass substrate 51 and the transparent electrode 52 in parallel to them in a direction perpendicular to the arranging direction of the transparent electrode 52. This film of polyimide 53 is finally formed as an insulating bulkhead. Next, as shown in FIG. 4B, an $SiO_2$ film 54 used as material to form an overhang portion is formed by the method of spattering so that an appropriate film thickness can be obtained. After that, as shown in FIG. 4C, a photoresist pattern 55 is formed by the method of photolithography on the $SiO_2$ film 54.

Further, as shown in FIG. 4D, the $SiO_2$ film 54 is etched so as to be the same pattern as that of the photoresist pattern 55 while the photoresist pattern 55 is used as a mask in the process of etching. Next, as shown in FIG. 4E, the film of polyimide 53 is vertically etched by the method of reactive etching in which $O_2$ is used as an etching gas. Then, as shown in FIG. 4F, the sides of polyimide 53 are equally subjected to side etching by the method of wet etching in which an alkali solution is used. Due to the foregoing, the overhang portion can be formed, in which the $SiO_2$ film 54 protrudes to the transverse direction from the sides of polyimide 53.

After the process in which the overhang portion is formed, an organic thin film is formed on the upper surface of the transparent electrode 52. Further, a cathode is formed on this organic thin film by the method of vapor deposition. In the process of vapor deposition of the cathode, metallic vapor is incident upon the glass substrate 51 from above, so that metallic vapor can not come round to the side of the transparent electrode 52 and a short circuit of the transparent electrode 52 with the cathode formed by vapor deposition can be prevented.

However, according to the manufacturing method described above, the $SiO_2$ film 54 must be etched and then polyimide 53 must be successively etched in the process until the overhang portion is formed. Even after the above two etching processes, an etching process is required in which polyimide 53 is etched in an alkaline solution. Accordingly, it is necessary to conduct the etching processes three times in total. Even if polyimide 53 is subjected to wet etching in an alkaline solution at the beginning, it is necessary to go through two etching processes, which affect the yield of products. Since the $SiO_2$ film 54 in which plastic deformation tends to occur is formed on polyimide 53 in which elastic deformation tends to occur and the thickness of which is relatively large, cracks are easily caused in the $SiO_2$ film 54 by the influence of heat, and there is a possibility that the reliability is deteriorated.

As described above, when the conventional organic EL element is manufactured, it is necessary to conduct etching at least twice in the process until the overhang portion is formed so that the anode made of ITO formed on the glass substrate can not be short-circuited with the cathode. Therefore, the working process becomes complicated and the productivity is affected. Since hard $SiO_2$ is formed on soft polyimide, cracks tend to be caused on the $SiO_2$ film 54, and the reliability is deteriorated.

JP-A No. 8-315981 discloses a manufacturing method in which a reversely tapered portion is formed by resist. However, it is impossible in principle to form a reversely tapered portion with the positive type resist. When negative type resist is used, it is easy to form a reversely tapered portion. However, it is impossible to form an acute angle in the gate portion. Therefore, metallic vapor must be incident upon the substrate after the formation of the cathode. Accordingly, various devices are required, which reduce the yield of products. When resist for image rehearsal, for example, AZ5214, which is the brand name of Hekisuto K.K., is used, it is easily possible to form a bulkhead, the taper angle of which is small. However, it has poor adhesion to the substrate, and further the profile is greatly affected by the exposure and development. Therefore, it is impossible to form a reversely tapered portion while the yield of products is maintained high.

SUMMARY OF THE INVENTION

It is an object of the present invention to provide an organic EL element, the structure of which is simple, the manufacturing cost of which is low, and the reliability of which is high. It is another object of the present invention to provide a method of manufacturing the organic EL element. It is still another object of the present invention to optimize an image generation on a display on which the organic EL element is used.

The present invention provides an organic electroluminescence element comprising: a first electrode provided on a substrate; an insulating bulkhead from which a portion of the first electrode is exposed, the insulating bulkhead being formed into a thickness so that the insulating bulkhead can be protruded to the above of the first electrode; an organic thin film formed on the first electrode and the bulkhead; and a second electrode formed on the organic thin film, wherein an overhang portion is formed at an upper end of the insulating bulkhead by a resist film used for etching the bulkhead in accordance with a region in which the organic thin film is formed.

Due to the above structure, when the resist film is left as it is and formed into an overhang portion, it is possible to provide an electroluminescence element, the lamination structure with respect to the substrate of which is simple. One of first electrode and second electrode should be made of a transparent material. In the case that the first electrode is made of transparent material, the substrate should be also made of a transparent material.

Also, the present invention provides a method of manufacturing an organic electroluminescence element comprising the steps of: forming a first electrode on a substrate; forming an insulating bulkhead from which a portion of the first electrode is exposed, the insulating bulkhead being formed into a thickness so that the insulating bulkhead can be protruded to the above of the first electrode; and forming a resist film at an upper end of the insulating bulkhead, the resist film being used for etching the bulkhead in accordance with a forming region of the organic thin film; and forming the resist film into an overhang portion with respect to the bulkhead by conducting side-etching on the insulating bulkhead.

According to the above method, only when the insulating bulkhead is subjected to side-etching so that an overhang portion can be formed while the resist film is left as it is, the organic electroluminescence element can be provided. Therefore, the number of the process required for the manufacture of the organic EL element can be reduced.

DESCRIPTION OF THE PREFERRED EMBODIMENTS

Figure 1A:
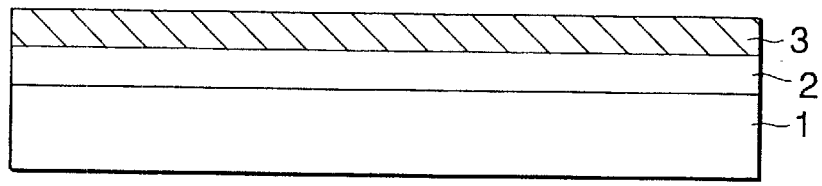
FIGS. 1A–1D are schematic illustration views showing a process of manufacturing an organic EL element of the present invention.

A first aspect of the element is an organic electroluminescence element, which comprises:

A first electrode provided on a substrate;

an insulating bulkhead from which a portion of the first electrode is exposed, the insulating bulkhead being formed into a thickness so that the insulating bulkhead can be protruded excess to a level of an upper end of the first electrode;

an organic thin film formed on the first electrode and the bulkhead; and a second electrode formed on the organic thin film, wherein the insulating bulkhead comprises an overhang portion made of a resist film used for etching the bulkhead as a mask, which is left at the upper end of the insulating bulkhead. Due to the above arrangement, it possible to obtain an electroluminescence element, the laminating structure of which is simple with respect to the substrate.

A second aspect of the element is an organic electroluminescence element according to the first aspect, wherein each of the first electrode and the substrate is made of transparent material.

A third aspect of the element is an organic electroluminescence element according to the first aspect, wherein the insulating bulkhead is made of material, the color tone of which is black. Since this bulkhead composes a black matrix for each pixel, an image can be displayed through the transparent electrode and the substrate.

A fourth aspect of the element is an organic electroluminescence element according to the third aspect, wherein the insulating bulkhead is made of a chromium oxide layer. Since chromium oxide is dark green, it is possible to form a black matrix by the bulkhead.

A fifth aspect of the element is an organic electroluminescence element according to the first aspect, wherein the resist film made of OFPR.

A sixth aspect of the element is an organic electroluminescence element according to the first aspect, wherein the transparent first electrode is made of ITO.

A seventh aspect of the element is an organic electroluminescence element according to the fourth aspect, wherein a thickness of the chromium oxide layer is 0.5–5 $\mu$m.

An eighth aspect of the element is an organic electroluminescence element according to the seventh aspect, wherein a thickness of the resist film is 0.5–3 $\mu$m.

A ninth aspect of the element is an organic electroluminescence element according to the first aspect, wherein the transparent first electrode is formed so as to be line-shaped patterns, the insulating bulkhead is formed so as to have line-shaped patterns perpendicular to those of the transparent first electrode, and the organic thin film and the second electrode are formed on an interval region between the insulating bulkhead, thereby the regions sandwiched with the transparent first electrode and the second electrode are formed to be a plurality of element region arranged in a matrix pattern.

A tenth aspect of the element is an organic electroluminescence element of the present invention, which comprises:

a first electrode provided on a substrate;

an insulating bulkhead from which a portion of the first electrode is exposed, the insulating bulkhead being formed into a thickness so that the insulating bulkhead can be protruded excess to a level of an upper end of the first electrode;

an organic thin film formed on the first electrode and the bulkhead; and a second electrode formed on the organic thin film, wherein the insulating bulkhead comprises an overhang portion and the insulating bulkhead is made of a chromium oxide layer.

A eleventh aspect of the element is an organic electroluminescence element according to the tenth aspect, wherein each of the first electrode and the substrate is made of transparent material.

A twelfth aspect of the element is an organic electroluminescence element according to the tenth aspect, wherein the overhang portion is made of OFPR.

A thirteenth aspect of the element is an organic electroluminescence element according to the tenth aspect, wherein the transparent first electrode is made of ITO.

A fourteenth aspect of the element is an organic electroluminescence element according to the tenth aspect, wherein a thickness of the chromium oxide layer is 0.5–5 µm.

A fifteenth aspect of the element is an organic electroluminescence element according to the fourteenth aspect, wherein a thickness of the resist film is 0.5–3 µm.

A sixteenth aspect of the method is a method of manufacturing an organic electroluminescence of the present invention, which comprises the steps of:

forming a first electrode on a substrate;

forming an insulating film on an entire surface of the substrate on which the transparent first electrode is formed so as to have a thickness protruded to the above of the first electrode;

forming a photoresist pattern on the insulating film;

etching the insulating film by using the photoresist pattern as a mask so that the insulating film forms an insulating bulkhead from which a portion of the first electrode is exposed, and the photoresist pattern has an overhang portion formed by a side etching; and forming an organic thin film and a conductive layer on the first electrode and the photoresist pattern, wherein the insulating bulkhead is formed into a thickness so that the insulating bulkhead can be protruded to the above of the first electrode.

According to the above method, only when the insulating bulkhead is subjected to side-etching so that an overhang portion can be formed while the resist film is left as it is, the organic electroluminescence element can be provided. Therefore, time and personnel required for manufacture can be reduced.

A seventeenth aspect of the method is a method of manufacturing an organic electroluminescence element according to the fourteenth aspect, wherein each of the first electrode and the substrate is made of transparent material.

An eighteenth aspect of the method is a method of manufacturing an organic electroluminescence element according to the seventeenth aspect, wherein the insulating bulkhead is made of a chromium oxide layer and the first electrode is made of ITO, the step of etching comprises two steps of an anisotropic etching and isotropic etching.

A nineteenth aspect of the method is a method of manufacturing an organic electroluminescence element according to the seventeenth aspect, wherein the insulating bulkhead is made of a chromium oxide layer and the first electrode is made of ITO, the step of etching comprises a wet etching by cerium secondary nitrate.

A twentieth aspect of the method is a method of manufacturing an organic electroluminescence element according to the seventeenth aspect, wherein the step of forming the transparent first electrode comprises a step of patterning so as to be arranged in line-shaped patterns, and the etching step comprises a step of patterning so as to be arranged in line-shaped patterns perpendicular to that of transparent first electrode, thereby the organic thin film and the second electrode are formed on an interval region between the insulating bulkhead, and the regions sandwiched with the transparent first electrode and the second electrode are formed to be a plurality of element region arranged in a matrix pattern.

Referring to the accompanying drawings, a specific example of the embodiment of the present invention will be explained as follows.

Embodiment 1

Figure 1B:
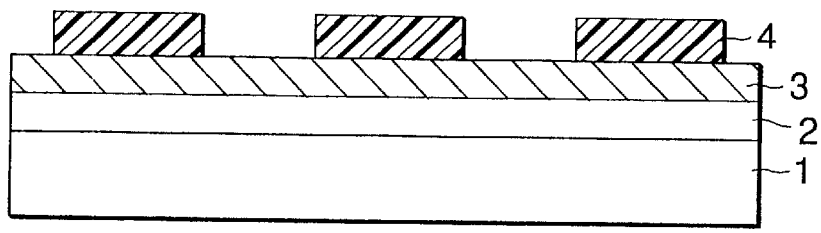
Figure 1C:
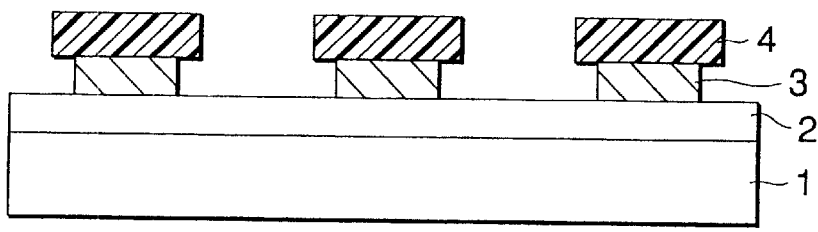
Figure 1D:
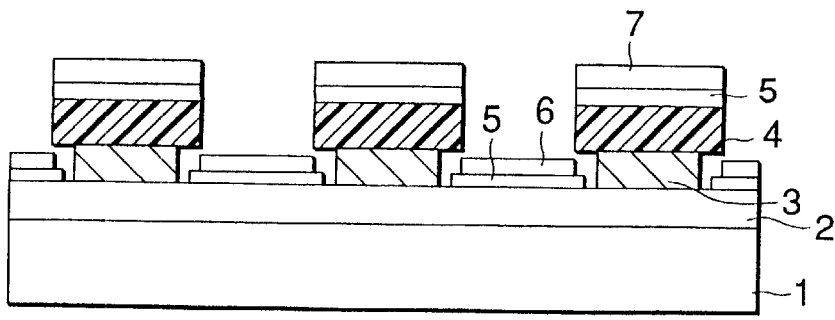

FIGS. 1A–1D are a schematic illustration showing a process of a manufacturing an organic EL element of the present invention. FIG. 1D is a longitudinal cross-sectional view of a manufactured organic EL element.

According to the manufacturing method of the present invention, as shown in FIG. 1A, an anode is made of a transparent electrode 2 on a glass substrate 1 by means of patterning, wherein ITO is subjected to patterning for forming the transparent electrode 2. In this case, as explained in the conventional example, a plurality of rows of transparent electrodes 2 are provided in parallel to each other at regular intervals of 0.1 to 0.3 µm on the glass substrate 1. Although the width of the transparent electrode 2 depends upon the number of pixels, it is 300 µm or less in the case of a display. A chromium oxide layer 3 made of $Cr_2O_3$, the thickness of which is 0.5 to 5 µm, used for forming an insulating bulkhead is formed by the method of spattering so that the chromium oxide layer 3 can be arranged in a direction perpendicular to the arranging direction of the transparent electrode 2. In this connection, this chromium oxide layer 3 is formed on the overall surface of the transparent electrode 2, and then resist is subjected to patterning, so that a plurality of rows of the chromium oxide layer 3 can be formed in parallel to each other at regular intervals. The width of each row is 10 to 50 µm, and the interval between the rows is 100 to 300 µm. The ITO and glass substrate should be transparent so as to have a transmittance more than 70% at the wavelength of visible rays or 400–800 nm.

As shown in FIG. 1B, after the formation of the chromium oxide layer 3, a pattern of the resist film 4 made of OFPR is formed on this chromium oxide layer 3. As conventionally known, this resist film 4 is obtained in the following manner. A film of photoresist, the thickness of which is, for example, 0.5 to 3 µm, is formed by the method of spin coating. Then, the thus obtained film of photoresist is processed by the common method of photolithography so that the resist film 4 can be left.

When the organic EL element is manufactured, the following conditions are indispensable. The transparent electrode 2, which is provided as an anode, is not short-circuited with the cathode 6 formed on an upper surface of the organic thin film 5, which is formed on the transparent electrode 2, by means of metallic vapor deposition. Further the cathodes 6 corresponding to the organic thin films 5 are electrically insulated from each other.

Concerning the former condition, it is possible to prevent the cathode 6 from being short-circuited to the transparent electrode 2 as follows. For example, while the organic thin film 5 is deposited, the glass substrate 1 is rotated. Alternatively, inert gas such as Ar gas is introduced in the process of depositing the film so that the mean free path can be shortened and the organic thin film 5 can be deposited onto the glass substrate at random. Due to the foregoing, the organic thin film 5 can be deposited at a position close to the bulkhead, that is, the organic thin film 5 can be formed at a position closer to the chromium oxide layer 3 than the cathode 6. Therefore, the occurrence of a short circuit between the cathode 6 and the transparent electrode 2 can be prevented.

Concerning the latter condition, as shown in FIG. 1D, since the chromium oxide layer 3 has an insulating property, when this chromium layer 3 is used as an insulating bulkhead and the resist film 4 located at an upper position of the chromium layer 3 is formed into an overhang portion, it is possible to prevent the transparent electrode 2 from being short-circuited with the cathode 6 and further the cathodes 6 can be insulated from each other. In order to realize the aforementioned matter, the chromium oxide layer 3 may be subjected to side etching. Since the object of this side etching is the chromium oxide layer 3 and the transparent electrode 2 made of ITO, wet etching in which a solution is used may be conducted.

That is, when etching is conducted on the ITO which is the material of the transparent electrode 2, hydrochloric acid is generally used, and no damage is done to $Cr_2O_3$ by hydrochloric acid. Alternatively, as an etchant by which etching can be conducted only on the chromium oxide layer 3 without doing any damage to ITO, for example, it is possible to use a solution, the composition of which is cerium secondary nitrate ammonia: 85 g, perchloric acid: 25 g, and water: 500 cc. Consequently, when the above etchant is used, the chromium oxide layer 3 is subjected to side etching as shown in FIG. 1C. That is, it becomes possible to form an overhang portion in which the resist film 4 is protruded from the chromium oxide layer 3 in the width direction.

After the overhang portion has been formed in this way, the organic thin film 5 is formed in a portion on the transparent electrode 2 divided by the chromium oxide layer 3 as shown in FIG. 1D. The organic thin film 5 is constituted by a Hall transport layer of TPD and a photo luminescent layer of $Alq_3$. When metallic vapor is deposited from above the glass substrate 1 by the method of vapor deposition, the cathode 6 of a metallic film is formed on an upper surface of the organic thin film 5, and at the same time the organic thin film 5 and the vapor-deposited metal 7 are deposited on an upper surface of the resist film 4. In the case of vapor deposition of the metal described above, in the same manner as that of the conventional overhang portion, the cathodes 6 are positively separated from each other by the insulating chromium oxide layer 3, and an intrusion of the vapor-deposited metal 7 onto the circumference of the chromium oxide layer 3 can be blocked by the overhang portion. Accordingly, the occurrence of a short circuit between the cathode 6 and the transparent electrode 2 can be prevented.

Figure 2:
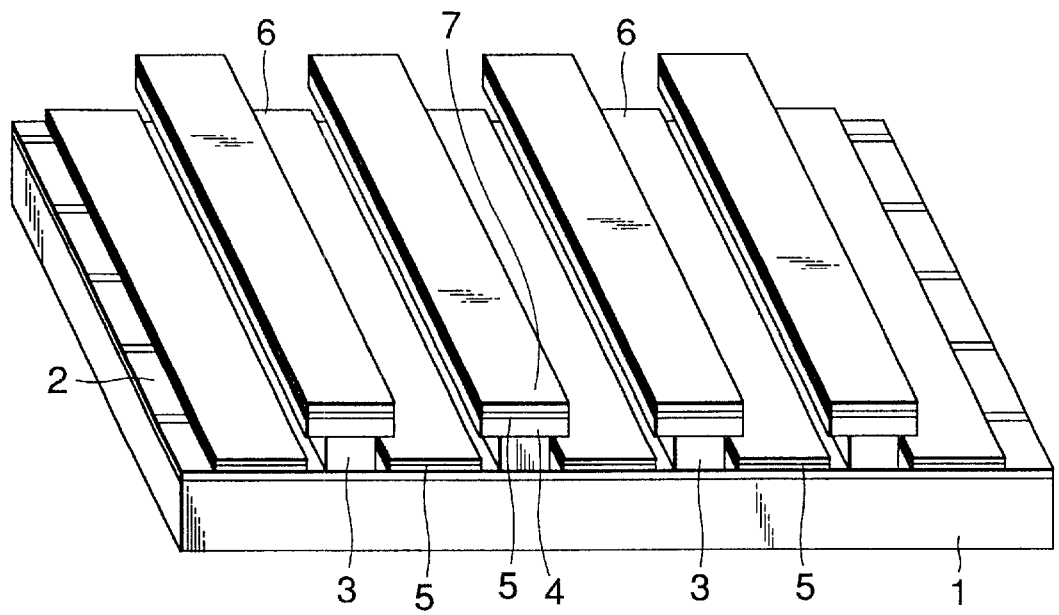
FIG. 2 is a perspective view showing an arrangement pattern of chromium oxide layers on an organic EL element display.

FIG. 2 is a perspective view showing an arrangement pattern of chromium oxide layers on an organic EL element display.

In FIG. 2, the transparent electrode 2 and the chromium oxide layer 3 are formed so as to be line-shaped patterns, rows of the transparent electrode 2 are perpendicular to those of the chromium oxide layer 3. Further the organic thin film 5 and the cathode 6 are formed on the transparent electrode 2 located at the interval region between lines of the chromium oxide layer 3. Regions sandwiched with the transparent electrode 2 and the cathode 6, are formed in a matrix pattern, and constitute cell regions. Bottom surface regions corresponding to the respective cell regions become a surface from which light is extracted. In FIG. 2, a bottom surface of the chromium oxide layer 3 faces the glass substrate 1 through the transparent electrode 2. Therefore, when the chromium oxide layer 3 is viewed from the surface from which light is extracted, this chromium oxide layer 3 is included as a portion of an image of the organic EL element display.

As shown in FIG. 2, the chromium oxide layer 3 is formed into a pattern on which the chromium oxide layer 3 crosses the transparent electrode 2, that is, the chromium oxide layer 3 appears in such a manner that it crosses the luminescent surface on the organic thin film 5. Since $Cr_2O_3$ is dark green, the chromium oxide layer 3 performs a function similar to the black matrix. Therefore, the image is tightened by the chromium oxide layer 3, so that the colors of R(red), G(green) and B(blue) can be prevented from being mixed with each other.

On the other hand, each area of the organic thin film 5 sandwiched by the transparent electrode 2 and cathode 6, corresponding to one pixel, can be further divided into a plurality of(for example three or four) sub-pixels corresponding to the colors of R,G,B.

Embodiment 2

Figure 3:
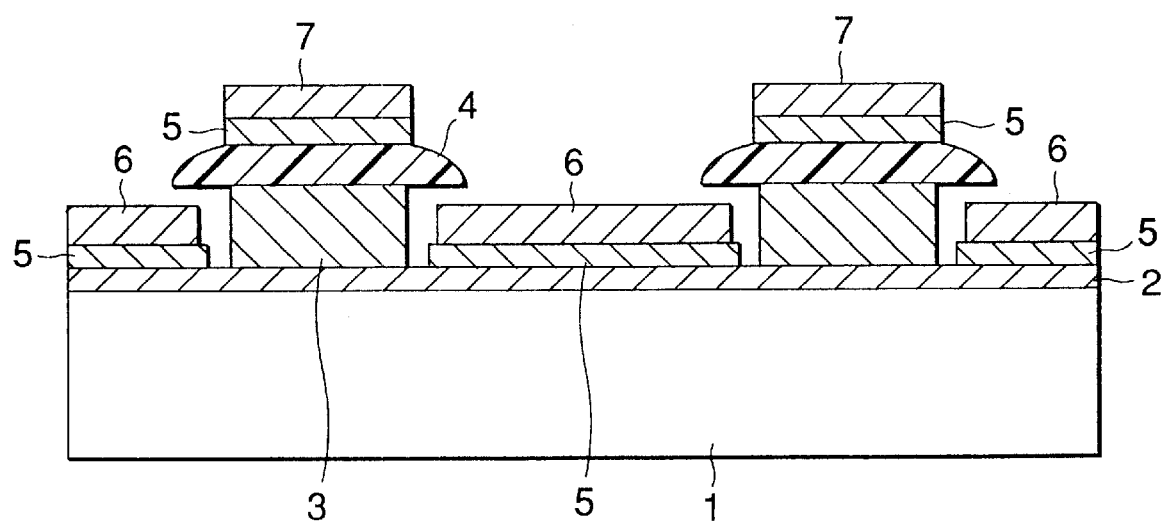
FIG. 3 is a longitudinal cross-sectional view of a second embodiment of the organic EL element of the present invention.
Figure 4A:
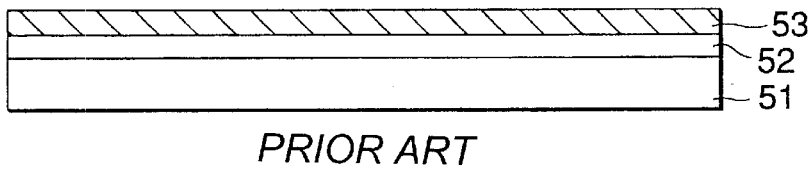
FIGS. 4A–4F are schematic illustration views showing a process of manufacturing a conventional organic EL element.
Figure 4B:
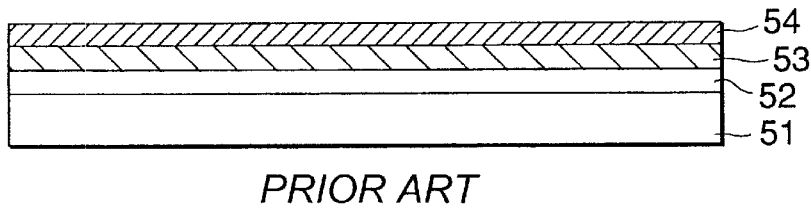
Figure 4C:
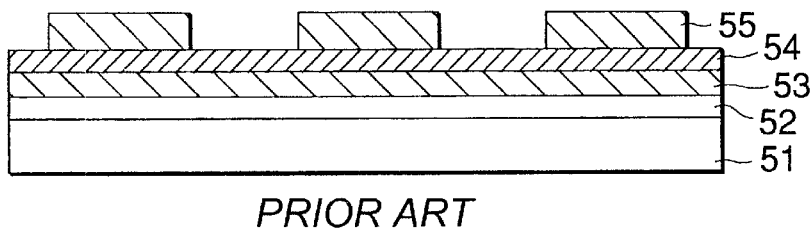
Figure 4D:
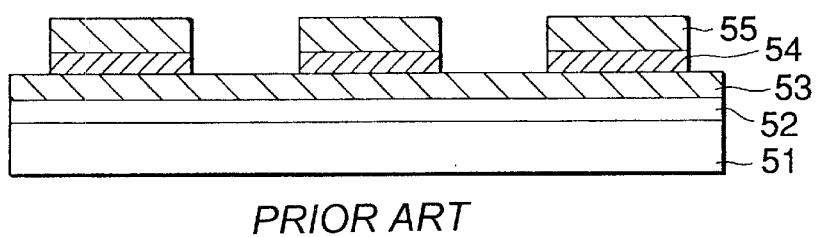
Figure 4E:
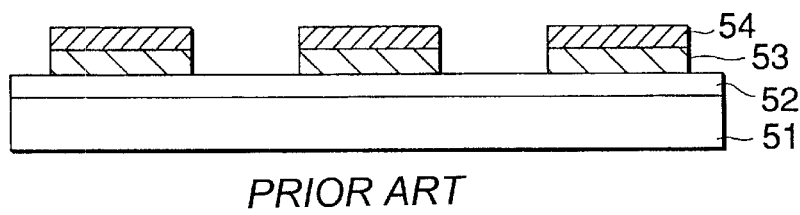
Figure 4F:
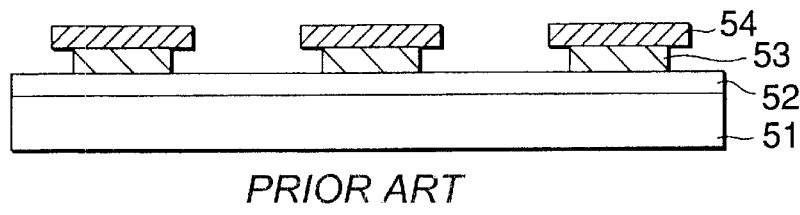

FIG. 3 shows a second embodiment of the present invention. As shown in FIG. 3, resist film 4 is patterned so that the upper edge thereof is rounded. For example after patterning by anisotropic etching, an isotropic etching is conducted so that the edge is rounded. Other portions are formed as same as the first embodiment. According to the second embodiment, passivation film which covers on the entire surface of the electroluminescence element can be formed in a good manner of the step coverage.

According to the first aspect of the present application, the following effects can be provided. When the resist film is formed into an overhang portion while the resist film is being left as it is, it is possible to obtain an electroluminescence element, the laminating structure on the substrate of which is simple. Accordingly, compared with the conventional structure, the number of laminated films necessary for the formation of the overhang portion can be reduced. Therefore, the material expenses can be reduced.

According to the second aspect of the present application, the bulkhead forms a black matrix for each pixel. Therefore, colors can be tightened on the luminescent image, and it becomes possible to reproduce an image of higher quality.

According to the third aspect of the present application, when $Cr_2O_3$ is used, a black matrix can be formed by the bulkhead. Therefore, image reproduction can be conducted in a good condition.

According to the fourth aspect of the present application, only when side etching is conducted on the insulating bulkhead, the overhang portion can be formed while the resist film is left as it is. Therefore, time and personnel required for manufacture can be reduced, and the yield of products can be enhanced.

What is claimed is:

1. An organic electroluminescence element comprising:
a first electrode formed on a substrate;
an insulating bulkhead formed on the first electrode;
an organic thin film formed on the first electrode; and
a second electrode formed on the organic thin film,
wherein the organic thin film and second electrode are formed so as to leave a portion of the first electrode exposed, and the insulating bulkhead comprises a wall portion made of metal oxide, and an overhang portion made of a resist film used for etching the bulkhead as a mask, which is left at the upper end of the insulating bulkhead.

2. An organic electroluminescence element according to claim 1, wherein each of the first electrode and the substrate is made of a transparent material.

3. An organic electroluminescence element according to claim 1, wherein the insulating bulkhead is a material, the color tone of which is black.

4. An organic electroluminescence element according to claim 1, wherein the wall portion of the insulating bulkhead is made of a chromium oxide layer.

5. An organic electroluminescence element according to claim 4, wherein a thickness of the chromium oxide layer is 0.5–5 µm.

6. An organic electroluminescence element according to claim 5, wherein a thickness of the resist film is 0.5–3 µm.

7. An organic electroluminescence element according to claim 1, wherein the resist film is made of photoresist material.

8. An organic electroluminescence element according to claim 1, wherein the first electrode is made of ITO.

9. An organic electroluminescence element according to claim 1, wherein the first electrode is arranged being formed so as to be line-shaped patterns, the insulating bulkhead is arranged being formed so as to be the line-shaped patterns perpendicular to that of the first electrode, and the organic thin film and the second electrode are formed on an interval region between the insulating bulkhead and on the resist film, thereby the regions sandwiched with the first electrode and the second electrode are formed to be a plurality of element region arranged in a matrix pattern.

10. An organic electroluminescence element according to claim 1, wherein a distance between the wall portion and the second electrode is shorter than a distance between the wall portion and the organic thin film.

11. An organic electroluminescence element according to claim 1 further comprising a second organic thin film formed on the insulating bulkhead.

12. An organic electroluminescence element according to claim 11 further comprising a metal formed on the second organic thin film.

* * * * *

UNITED STATES PATENT AND TRADEMARK OFFICE
CERTIFICATE OF CORRECTION

PATENT NO. : 6,351,066 B1 Page 1 of 1
DATED : February 26, 2002
INVENTOR(S) : Gyoutoku et al.

It is certified that error appears in the above-identified patent and that said Letters Patent is hereby corrected as shown below:

Column 6,
Line 17, please delete "a";

Column 7,
Line 61, please delete "formed" and insert therefor -- located --;

Column 9,
Line 3, please delete "a transparent material." and insert therefor -- transparent materials. --; and
Line 5, after "is" please insert -- made of --.

Signed and Sealed this

Eighteenth Day of June, 2002

Attest:

JAMES E. ROGAN
Attesting Officer    Director of the United States Patent and Trademark Office